US012720765B2

(12) United States Patent
Seo

(10) Patent No.: US 12,720,765 B2
(45) Date of Patent: Aug. 25, 2026

(54) SEMICONDUCTOR DEVICE HAVING IMPROVED OPERATING CHARACTERISTICS OF A MEMORY DEVICE

(71) Applicant: SK hynix Inc., Icheon-si (KR)

(72) Inventor: Soo Man Seo, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 721 days.

(21) Appl. No.: 17/899,367

(22) Filed: Aug. 30, 2022

(65) Prior Publication Data

US 2023/0200087 A1 Jun. 22, 2023

(30) Foreign Application Priority Data

Dec. 20, 2021 (KR) ........................ 10-2021-0182952

(51) Int. Cl.
*H10B 61/00* (2023.01)

(52) U.S. Cl.
CPC .................................... *H10B 61/00* (2023.02)

(58) Field of Classification Search
CPC ...... H10B 61/00; H10B 63/845; H10B 63/00; H10N 50/10; G06F 12/08
USPC ........... 257/443; 438/48, 66, 67, 73, 80, 982
See application file for complete search history.

(56) References Cited

U.S. PATENT DOCUMENTS 7,830,704 B1 11/2010 Mani
9,614,002 B1 4/2017 Hatcher et al.
2004/0233760 A1 11/2004 Guo et al.
2012/0155164 A1* 6/2012 Shukh ................. G11C 11/5607 365/171
2013/0064009 A1 3/2013 Kitano
2014/0250244 A1* 9/2014 Song ...................... H10B 61/00 710/5
2014/0347911 A1* 11/2014 Minemura ........... H10N 70/063 365/148

(Continued)

FOREIGN PATENT DOCUMENTS

CN 101964440 A 2/2011
CN 112599656 A 4/2021

(Continued)

OTHER PUBLICATIONS

First Office Action for CN Application No. 202211279390.1, mailed on Jul. 29, 2025, 14 pages with translation.

*Primary Examiner* — Didarul A Mazumder
(74) *Attorney, Agent, or Firm* — Ashurst Perkins Coie US LLP

(57) ABSTRACT

A semiconductor device includes a plurality of first line structures extending in a first direction, each of the plurality of first line structures including a first pinned layer exhibiting a magnetization in a fixed magnetization direction; a plurality of second line structures spaced apart from the first line structures and extending in a second direction intersecting the first direction; a plurality of first free layers each exhibiting a magnetization with a magnetization direction that is changeable, the first free layers respectively overlapping intersection regions of the first line structures and the second line structures between the first line structures and the second line structures; and a first tunnel barrier layer interposed between the first line structure and the first free layer.

17 Claims, 15 Drawing Sheets

(56) References Cited

U.S. PATENT DOCUMENTS

2020/0075854 A1* 3/2020 Park .................. G11C 13/0004
2021/0098687 A1* 4/2021 Lim ...................... H10B 61/20

FOREIGN PATENT DOCUMENTS

JP 2013197518 A 9/2013
KR 20110071711 A 6/2011

* cited by examiner

SEMICONDUCTOR DEVICE HAVING IMPROVED OPERATING CHARACTERISTICS OF A MEMORY DEVICE

PRIORITY CLAIM AND CROSS-REFERENCE TO RELATED APPLICATION

This patent document claims the priority and benefits of Korean Patent Application No. 10-2021-0182952 filed on Dec. 20, 2021, which is incorporated herein by reference in its entirety.

TECHNICAL FIELD

This patent document relates to memory circuits or devices.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high capacity semiconductor devices include semiconductor devices such as memory devices that can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an electronic fuse (E-fuse).

SUMMARY

The disclosed technology in this patent document includes various embodiments of a semiconductor device having improved operating characteristics and a simple manufacturing process.

In an embodiment, a semiconductor device includes: a plurality of first line structures extending in a first direction, each of the plurality of first line structures including a first pinned layer exhibiting a magnetization in a fixed magnetization direction; a plurality of second line structures spaced apart from the first line structures and extending in a second direction intersecting the first direction; a plurality of first free layers each exhibiting a magnetization with a magnetization direction that is changeable, the first free layers respectively overlapping intersection regions of the first line structures and the second line structures between the first line structures and the second line structures; and a first tunnel barrier layer interposed between the first line structure and the first free layer.

DETAILED DESCRIPTION

Figure 1A:
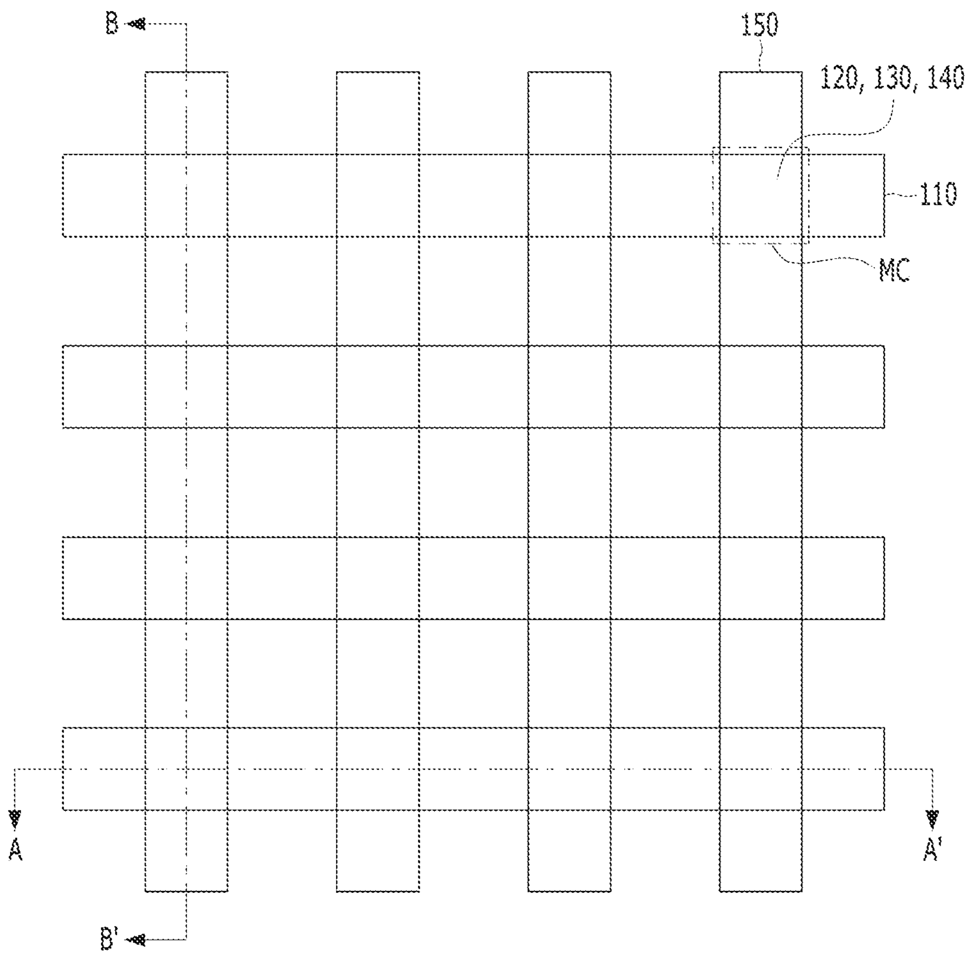
FIG. 1A is a plan view illustrating a memory device based on some embodiments of the disclosed technology.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
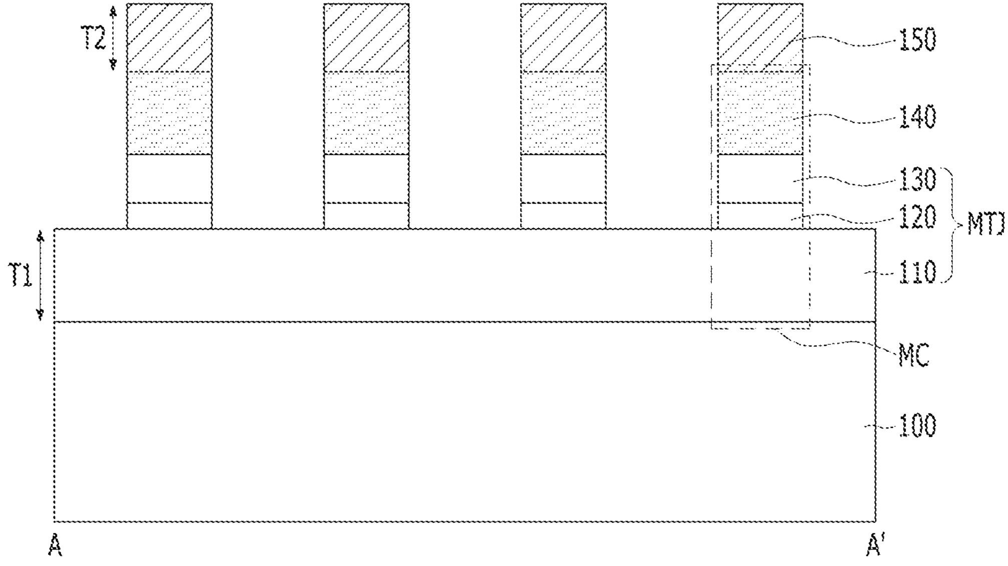
FIG. 1B is a cross-sectional view taken along a line A-A' of FIG. 1A.
Figure 1C:
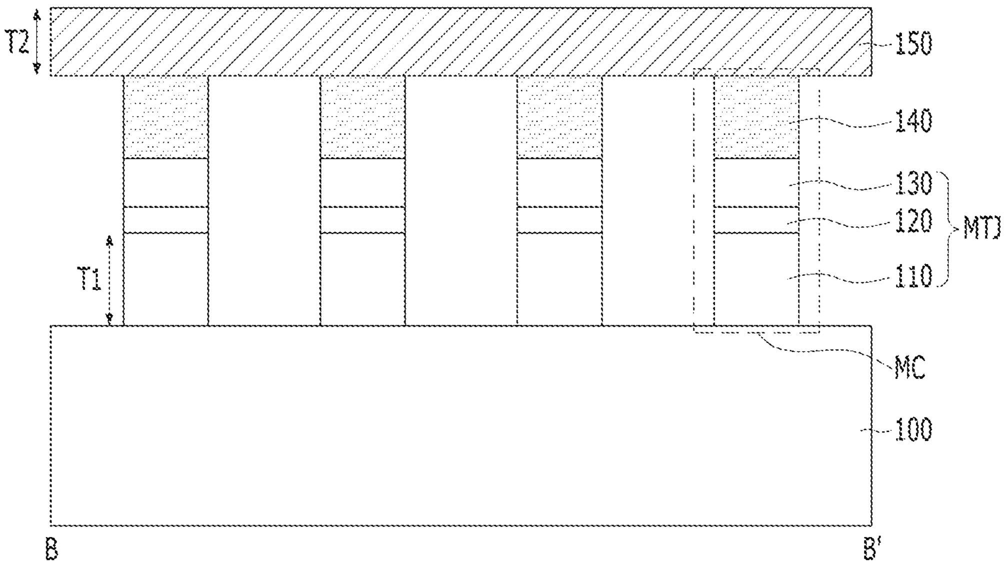
FIG. 1C is a cross-sectional view taken along a line B-B' of FIG. 1A.

FIG. 1A is a plan view illustrating a memory device based on some embodiments of the disclosed technology, FIG. 1B is a cross-sectional view taken along a line A-A' of FIG. 1A, and FIG. 1C is a cross-sectional view taken along a line B-B' of FIG. 1A. Hereinafter, for convenience of description, a direction substantially parallel to the line A-A' will be referred to as a first direction, and a direction substantially parallel to the line B-B' intersecting the line A-A' will be referred to as a second direction.

Referring to FIGS. 1A to 1C, the memory device based on some embodiments of the disclosed technology may include a substrate 100, a plurality of first line structures 110 disposed over the substrate 100 and extending in the first direction while being arranged to be spaced apart from each other in the second direction, a plurality of second line structures 150 disposed over the first line structures 110 and extending in the second direction while being arranged to be spaced apart from each other in the first direction, and a stacked structure of a tunnel barrier layer 120, a free layer 130, and a selection element layer 140, which overlaps each of intersection regions between the first line structures 110 and the second line structures 150.

The substrate 100 may include a semiconductor material such as silicon. Although not shown in FIGS. 1A to 1C, the substrate 100 may include a lower structure including, for example, a driving circuit electrically connected to the first line structure 110 and/or the second line structure 150 to drive or apply a voltage or current to the first line structure 110 and/or the second line structure 150.

The first line structure 110 may include at least a pinned layer, and thus a magnetic tunnel junction (MTJ) structure including the pinned layer, the tunnel barrier layer 120, and the free layer 130 may be formed. Furthermore, the first line structure 110 may further include one or more material layers or structures having various functions in order to improve properties required for the MTJ structure. As will be discussed below with reference to FIG. 1D, the disclosed technology can be implemented in some embodiments to provide the first line structure 110 and the MTJ structure including the first line structure 110.

Figure 1D:
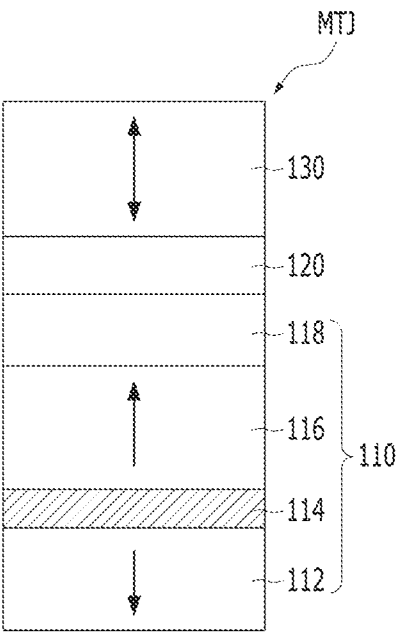
FIG. 1D is a view illustrating an MTJ structure based on some embodiments of the disclosed technology.

FIG. 1D is a view illustrating an MTJ structure based on some embodiments of the disclosed technology.

Referring to FIG. 1D, the MTJ structure may include the first line structure 110 having a multilayer structure including a pinned layer 116, the tunnel barrier layer 120 disposed over the first line structure 110, and the free layer 130 disposed over the tunnel barrier layer 120.

The free layer 130 may exhibit a magnetization with a direction that can be changed, that is, a changeable magnetization direction, and may store different data by changing the magnetization direction. In some implementations, the free layer 130 may be referred to as a data storage layer. The change in the magnetization direction in the free layer 130 may be due to a spin transfer torque from a spin polarized current in which the spin polarization of the charge carriers such as electrons in the current can be transferred to the free layer 130. In some implementations, the free layer 130 may have a magnetization direction substantially perpendicular to the surface of the free layer 130. For example, as indicated by an arrow in the free layer 130 in FIG. 1D, the magnetization direction of the free layer 130 may be changed between a top to bottom direction and a bottom to top direction. However, the disclosed technology is not limited thereto, and the free layer 130 may have a magnetization direction substantially parallel to the surface of the layer in other implementations.

The pinned layer 116 may have a fixed magnetization direction, and thus the magnetization direction of the pinned layer 116 may be contrasted with the magnetization direction of the free layer 130. In some implementations, the pinned layer 116 may be referred to as a reference layer. When the free layer 130 has a magnetization direction substantially perpendicular to the surface of the layer, the pinned layer 116 may also have a magnetization direction substantially perpendicular to the surface of the layer. For example, as indicated by an arrow in the pinned layer 116, the magnetization direction of the pinned layer 116 may be fixed from bottom to top. However, the disclosed technology is not limited thereto, and the magnetization direction of the pinned layer 116 may be fixed and may have a top-to-bottom direction. Alternatively, when the free layer 130 has a magnetization direction substantially parallel to the surface of the layer, the pinned layer 116 may also have a magnetization direction substantially parallel to the surface of the layer.

The tunnel barrier layer 120 may enable tunneling of electrons across a boundary between the free layer 130 and the pinned layer 116 according to a voltage or current applied through the top and bottom of the MTJ structure, thereby changing the magnetization direction of the free layer 130.

Each of the free layer 130 and the pinned layer 116 may have a single-layer structure or a multi-layer structure including a ferromagnetic material. As an example, each of the free layer 130 and the pinned layer 116 may include an alloy containing Fe, Ni or Co as a main component, for example, Co—Fe—B alloy, Co—Fe—B—X alloy (where X is Al, Si, or Ti, V, Cr, Ni, Ga, Ge, Zr, Nb, Mo, Pd, Ag, Hf, Ta, W or Pt), Fe—Pt alloy, Fe—Pd alloy, Co—Pd alloy, Co—Pt alloy, Fe—Ni—Pt alloy, Co—Fe—Pt alloy, Co—Ni—Pt alloy, etc. Alternatively, each of the free layer 130 and the pinned layer 116 may include a stacked structure such as Co/Pt, Co/Pd, or others, or an alternately stacked structure of a magnetic material and a non-magnetic material. The tunnel barrier layer 120 may include an insulating oxide, for example, an oxide such as MgO, CaO, SrO, TiO, VO, or NbO.

In the above-described MTJ structure, the magnetization direction of the free layer 130 may be changed according to an applied voltage or current, so that different data may be stored. When the magnetization directions of the free layer 130 and the pinned layer 116 are parallel to each other, the MTJ structure may be in a low resistance state, which may indicate data '1.' Conversely, when the magnetization directions of the free layer 130 and the pinned layer 116 are antiparallel to each other, the MTJ structure may be in a high resistance state, which indicate data '0.'

Furthermore, the first line structure 110 may further include a magnetic correction layer 112, a spacer layer 114, and an interface layer 118, in addition to the pinned layer 116.

The magnetic correction layer 112 may be disposed adjacent to the pinned layer 116 with the spacer layer 114 interposed therebetween. For example, the magnetic correction layer 112 may be disposed to face a lower surface of the pinned layer 116, which is opposite to an upper surface of the pinned layer 116 facing the free layer 130. The magnetic correction layer 112 may perform a function of canceling or reducing the influence of the stray magnetic field generated by the pinned layer 116. In this case, the influence of the stray magnetic field of the pinned layer 116 on the free layer 130 may be reduced, so that the deflection magnetic field in the free layer 130 may be reduced. The magnetic correction layer 112 may have a magnetization direction antiparallel to the magnetization direction of the pinned layer 116. In some embodiments, when the pinned layer 116 has a bottom-to-top magnetization direction, the magnetic correction layer 112 may have a top-to-bottom magnetization direction. However, unlike illustrated, when the pinned layer 116 has a top-to-bottom magnetization direction, the magnetic correction layer 112 may have a bottom-to-top magnetization direction. The magnetic correction layer 112 may have a single-layer structure or a multi-layer structure including a ferromagnetic material.

The spacer layer 114 may be interposed between the magnetic correction layer 112 and the pinned layer 116 to enable antiferromagnetic exchange coupling between the magnetic correction layer 112 and the pinned layer 116. The spacer layer 114 may include a non-magnetic conductive material. For example, the spacer layer 114 may include a metal material such as Cr, Ru, Ir, or Rh.

The interface layer 118 may be interposed between the pinned layer 116 and the tunnel barrier layer 120 to block the metal of the pinned layer 116 from diffusing into the tunnel barrier layer 120, and may prevent the crystal growth of the tunnel barrier layer 120 from affecting the pinned layer 116. In addition, the interface layer 118 may be exchange-coupled with the pinned layer 116 to prevent a change in the magnetization direction of the pinned layer 116. The interface layer 118 may have a single-layer structure or a multi-layer structure including a ferromagnetic material. For example, the interface layer 118 may include an alloy based on Fe, Co, B, or a combination thereof, for example, Fe—Co—B alloy.

However, the first line structure 110 is not limited to what is illustrated in the drawings, and at least one of the magnetic correction layer 112, the spacer layer 114, and the interface layer 118 may be omitted. When all of the magnetic correction layer 112, the spacer layer 114, and the interface layer 118 are omitted from the first line structure 110, the first line structure 110 may include only the pinned layer 116, and may have a single-layer structure. Alternatively, the first line structure 110 may further include one or more other layers (not shown) for improving properties of the MTJ structure.

Referring to FIGS. 1A to 1C again, the selection element layer 140 may be disposed over the MTJ structure. The selection element layer 140 may function to prevent current leakage that may occur between the MTJ structures sharing the first line structure 110 or the second line structure 150. To this end, the selection element layer 140 may have a threshold switching characteristic, for example, a small amount of current flows when the applied voltage is less than a predetermined threshold value, but the amount of current rapidly increases when the applied voltage becomes greater than or equal to the predetermined threshold value. This threshold value may be referred to as a threshold voltage, and the selection element layer 140 may be implemented in a turned-on state or a turned-off state based on the threshold voltage. The selection element layer 140 may include a diode, an ovonic threshold switching (OTS) material such as a chalcogenide-based material, a mixed ionic electronic conducting (MIEC) material such as a metal-containing chalcogenide-based material, a metal insulator transition (MIT) material such as $NbO_2$ or $VO_2$, a tunneling insulating layer having a relatively wide band gap such as $SiC_2$ or $Al_2O_3$, or others.

In some embodiments, the stacked structure of the tunnel barrier layer 120, the free layer 130, and the selection element layer 140 may be patterned together to have sidewalls aligned with each other. Furthermore, the stacked structure of the tunnel barrier layer 120, the free layer 130, and the selection element layer 140 may have a rectangular pillar shape which has both sidewalls aligned with both sidewalls of the second line structure 150 in the first direction and both sidewalls aligned with both sidewalls of the first line structure 110 in the second direction. However, the disclosed technology is not limited thereto, and the sidewalls of the tunnel barrier layer 120, the free layer 130, and the selection element layer 140 may not be aligned with each other. Alternatively, the sidewalls of the tunnel barrier layer 120, the free layer 130, and the selection element layer 140 may be aligned with each other while not being aligned with the sidewalls of the first line structure 110 and/or the second line structure 150.

In the intersection region of the first line structure 110 and the second line structure 150, the MTJ structure including the first line structure 110, the tunnel barrier layer 120, and the free layer 130, and the selection element layer 140 may form a memory cell MC. Even if the first line structure 110 has a line shape extending in the first direction, the free layer 130, which is used to store data, may have an island shape overlapping the intersection region of the first line structure 110 and the second line structure to be spaced apart from another free layer 130 adjacent thereto. Therefore, it may be possible to form the memory cell MC at each of the intersection regions of the first line structures 110 and the second line structures 150. The first line structure 110 may constitute part of the MTJ structure and also transmit a voltage or current to one end, for example, a lower end of the memory cell MC. For example, the first line structure 110 may be used as both the part of the MTJ structure and the voltage/current transmission line (e.g., bit line, word line). Since both the ferromagnetic material and/or the nonmagnetic material forming the first line structure 110 are conductive materials, a function of transmitting a voltage or current may be sufficiently performed.

The second line structure 150 may function to transmit a voltage or current to the other end, for example, an upper end of the memory cell MC. Accordingly, a current flow may occur through the first line structure 110, the memory cell MC, and the second line structure 150, thereby writing data to the memory cell MC or reading data from the memory cell MC. Since the second line structure 150 does not constitute part of the MTJ structure unlike the first line structure 110, it may have a single-layer structure or a multi-layer structure including a low-resistance conductive material. For example, the second line structure 150 may include a metal such as platinum (Pt), tungsten (W), aluminum (Al), copper (Cu), tantalum (Ta), or titanium (Ti), a metal nitride such as titanium nitride (TiN), or tantalum nitride (TaN), or a combination thereof. However, the second line structure 150 may have substantially the same structure as the first line structure 110.

In some implementations of the disclosed technology, the first line structure 110 may function as one of a word line and a bit line for driving the memory cell MC and reading or writing data from or to the memory cell MC, while constituting a part of the MTJ structure, and the second line structure 150 may function as the other of the word line and the bit line. However, since the first line structure 110 includes a ferromagnetic material, when the second line structure 150 includes a low-resistance conductive material, the specific resistivity of the first line structure 110 may be greater than that of the second line structure 150. However, the resistance of the first line structure 110 may be reduced by relatively increasing the thickness T1 of the first line structure 110. For example, the thickness T1 of the first line structure 110 may be greater than the thickness T2 of the second line structure 150.

The memory device implemented based on some embodiments of the disclosed technology can achieve the following effects.

In an example memory device in which a memory cell including an MTJ structure and a selection element layer is disposed between a word line and a bit line crossing each other, a patterning process using a mask and etching process for forming each of the word line, the memory cell, and the bit line are required, rendering the fabrication process complicated and costly. In addition, since the memory cell includes the multi-layered MTJ structure and the selection element layer, the difficulty of an etching process for forming the memory cell may increase. On the other hand, in some embodiments of the disclosed technology, since the first line structure 110 including the pinned layer 116 replaces the word line and/or the bit line, and the stacked structure of the tunnel barrier layer 120, the free layer 130, and the selection element layer 140 is formed in an island shape, thereby simplifying the fabrication process and reducing the manufacturing cost. In addition, since the memory cell MC is formed by the etching process of the first line structure 110 and the etching process of the stacked structure of the tunnel barrier layer 120, the free layer 130, and the selection element layer 140, the difficulty of the etching process may be reduced.

In addition, an increase in the specific resistivity when the first line structure 110 including the pinned layer 116 is used, may be resolved by increasing the thickness of the first line structure 110. Even if the thickness of the first line structure 110 is increased, since at least one of a conventional word line and a bit line is omitted, the overall thickness of the memory device may be reduced. For example, miniaturization of the memory device may be possible.

Furthermore, when the pinned layer 116 is formed in a line shape, stability of the pinned layer 116 may be increased, so that the magnetization of the pinned layer 116 may be more easily maintained. This is because stability, in particular, thermal stability of the magnetic material is proportional to the volume of the magnetic material. As a result, the operating characteristics of the memory device may be improved.

Although FIGS. 1A to 1C illustrate memory cells as being arranged between two upper and lower lines crossing each other, for example, the memory cells as being arranged in a single layer. However, the disclosed technology is not limited thereto. In some implementations, three or more lines may be stacked over the substrate in a vertical direction, and memory cells may be arranged between two adjacent lines in the vertical direction. For example, the memory cells may be arranged in two or more layers, as will be discussed with reference to FIGS. 2A to 2C.

Figure 2A:
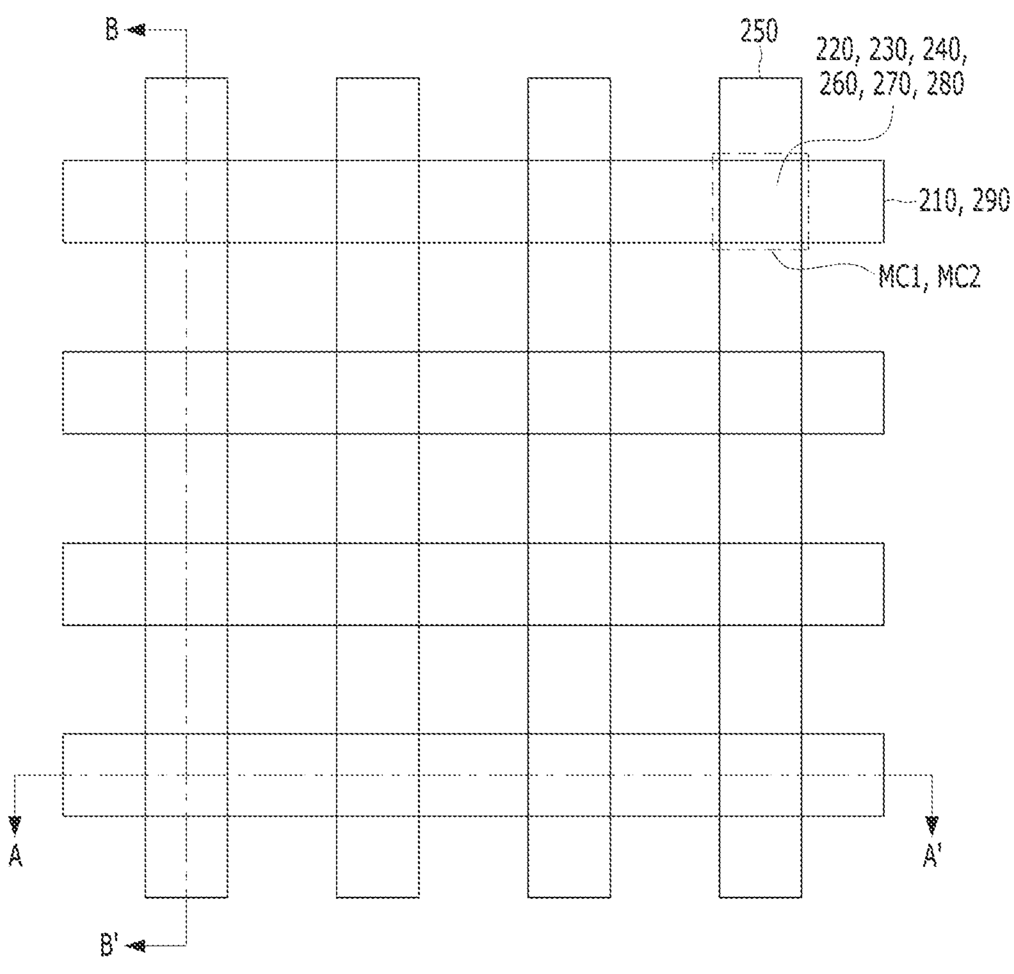
FIG. 2A is a plan view illustrating a memory device based on some embodiments of the disclosed technology.
Figure 2B:
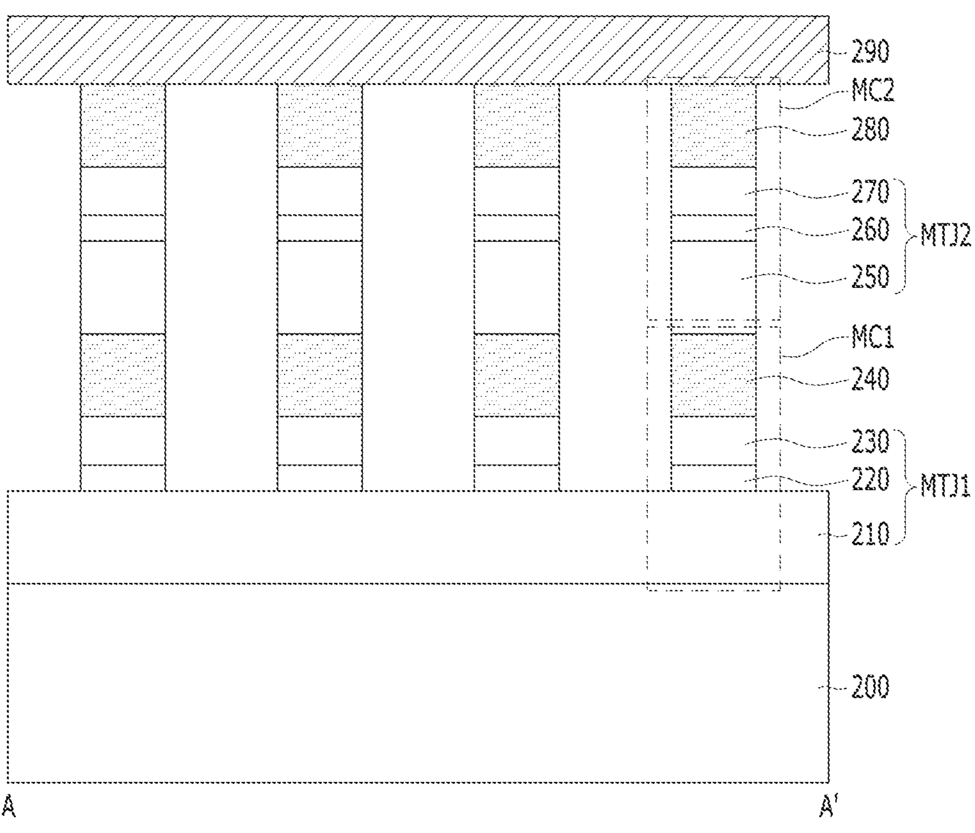
FIG. 2B is a cross-sectional view taken along a line A-A' of FIG. 2A.
Figure 2C:
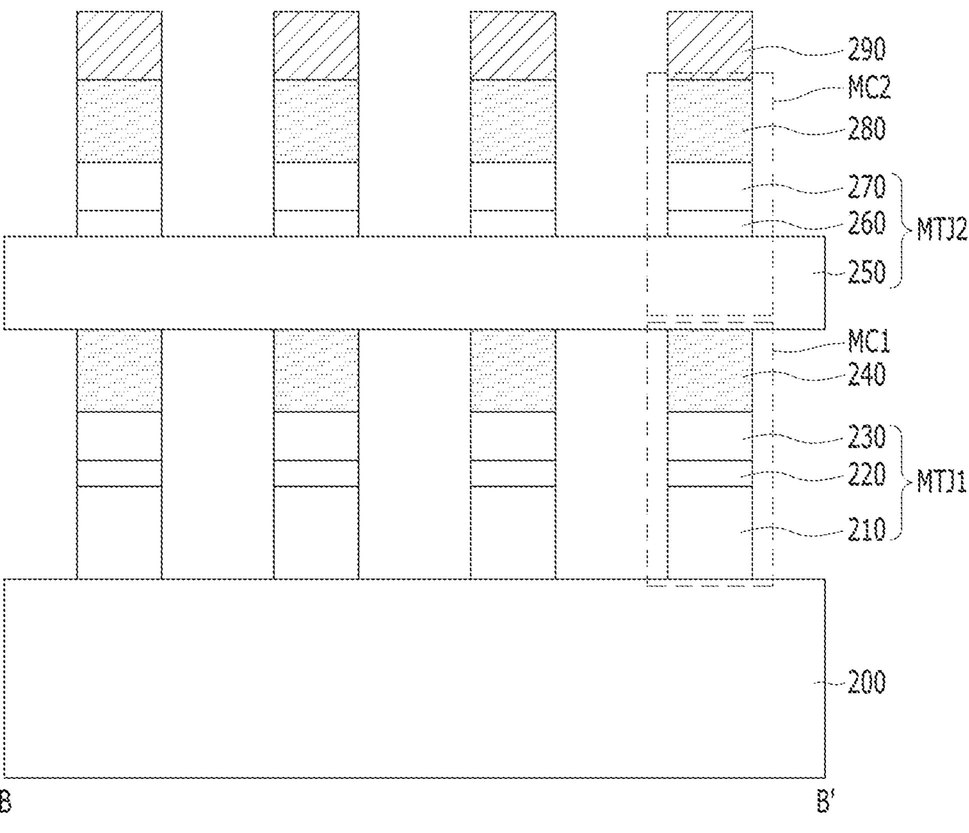
FIG. 2C is a cross-sectional view taken along a line B-B' of FIG. 2A.

FIG. 2A is a plan view illustrating a memory device based on some embodiments of the disclosed technology, FIG. 2B is a cross-sectional view taken along a line A-A' of FIG. 2A, and FIG. 2C is a cross-sectional view taken along a line B-B' of FIG. 2A.

Referring to FIGS. 2A to 2C, the memory device implemented based on some embodiments of the disclosed technology may include a substrate 200, a plurality of first line structures 210 disposed over the substrate 200 and extending in the first direction while being arranged to be spaced apart from each other in the second direction, a plurality of second line structures 250 disposed over the first line structures 210 and extending in the second direction while being arranged to be spaced apart from each other in the first direction, a plurality of third line structures 290 disposed over the second line structures 250 and extending in the first direction while being arranged to be spaced apart from each other in the second direction, a stacked structure of a first tunnel barrier layer 220, a first free layer 230, and a first selection element layer 240, which overlaps each of intersection regions of the first line structures 210 and the second line structures 250 between them, and a stacked structure of a second tunnel barrier layer 260, a second free layer 270, and a second selection element layer 280, which overlaps each of intersection regions of the second line structures 250 and the third line structures 290 between them.

The first line structure 210 may include at least a pinned layer, and thus a first MTJ structure including the pinned layer, the first tunnel barrier layer 220, and the first free layer 230 may be formed. The first line structure 210 may have substantially the same layer structure as the first line structure 110 of the above-described embodiment. For example, the first line structure 210 may have substantially the same layer structure as the first line structure 110 illustrated in FIG. 1D.

The first selection element layer 240 may be disposed over the first MTJ structure. In some embodiments, the stacked structure of the first tunnel barrier layer 220, the first free layer 230, and the first selection element layer 240 may be patterned together to have sidewalls aligned with each other. Furthermore, the stacked structure of the first tunnel barrier layer 220, the first free layer 230, and the first selection element layer 240 may have a rectangular pillar shape with both sidewalls aligned with both sidewalls of the second line structure 250 in the first direction and both sidewalls aligned with both sidewalls of the first line structure 210 in the second direction. However, the disclosed technology is not limited thereto, and the sidewalls of the first tunnel barrier layer 220, the first free layer 230, and the first selection element layer 240 may not be aligned with each other. Alternatively, the sidewalls of the first tunnel barrier layer 220, the first free layer 230, and the first selection element layer 240 may be aligned with each other while not being aligned with the sidewalls of the first line structure 210 and/or the second line structure 250.

In the intersection region of the first line structure 210 and the second line structure 250, the first MTJ structure including the first line structure 210, the first tunnel barrier layer 220, and the first free layer 230, and the first selection element layer 240 may form a first memory cell MC1. The first line structure 210 may constitute part of the first MTJ structure and also transmit a voltage or current to one end, for example, a lower end of the first memory cell MC1. For example, the first line structure 210 may be used as both the part of the first MTJ structure and the voltage/current transmission line (e.g., bit line, word line).

The second line structure 250 may function to transmit a voltage or current to the other end, for example, an upper end of the first memory cell MC1. Accordingly, a current flow may occur through the first line structure 210, the first memory cell MC1, and the second line structure 250, thereby writing data to the first memory cell MC1 or reading data from the first memory cell MC1.

Furthermore, the second line structure 250 may include at least a pinned layer, and thus a second MTJ structure including the pinned layer, the second tunnel barrier layer 260, and the second free layer 270 may be formed. The second line structure 250 may have substantially the same layer structure as the first line structure 210.

The second selection element layer 280 may be disposed over the second MTJ structure. In some embodiments, the stacked structure of the second tunnel barrier layer 260, the second free layer 270, and the second selection element layer 280 may be patterned together to have sidewalls aligned with each other. Furthermore, the stacked structure of the second tunnel barrier layer 260, the second free layer 270, and the second selection element layer 280 may have a rectangular pillar shape which has both sidewalls aligned with both sidewalls of the second line structure 250 in the first direction and both sidewalls aligned with both sidewalls of the third line structure 290 in the second direction. However, the disclosed technology is not limited thereto, and the sidewalls of the second tunnel barrier layer 260, the second free layer 270, and the second selection element layer 280 may not be aligned with each other. Alternatively, the sidewalls of the second tunnel barrier layer 260, the second free layer 270, and the second selection element layer 280 may be aligned with each other while not being aligned with the sidewalls of the second line structure 250 and/or the third line structure 290. The stacked structure of the second tunnel barrier layer 260, the second free layer 270, and the second selection element layer 280 may overlap the stacked structure of the first tunnel barrier layer 220, the first free layer 230, and the first selection element layer 240, and may have sidewalls aligned with sidewalls of the stacked structure of the first tunnel barrier layer 220, the first free layer 230, and the first selection element layer 240.

In the intersection region of the second line structure 250 and the third line structure 290, the second MTJ structure including the second line structure 250, the second tunnel barrier layer 260, and the second free layer 270, and the second selection element layer 280 may form a second memory cell MC2. The second line structure 250 may constitute part of the second MTJ structure and also transmit a voltage or current to one end, for example, a lower end of the second memory cell MC2. For example, the second line structure 250 may be used as both the part of the MTJ structure and the voltage/current transmission line (e.g., bit line, word line).

The third line structure 290 may function to transmit a voltage or current to the other end, for example, an upper end of the second memory cell MC2. Accordingly, a current flow may occur through the second line structure 250, the second memory cell MC2, and the third line structure 290, thereby writing data to the second memory cell MC2 or reading data from the second memory cell MC2.

The third line structure 290 may be formed to overlap the first line structure 210, and may have sidewalls aligned with the sidewalls of the first line structure 210. Since the third line structure 290 does not constitute part of an MTJ structure unlike the first line structure 210 and/or the second line structure 250, it may have a single-layer structure or a multi-layer structure including a low-resistance conductive material. For example, the third line structure 290 may include a metal such as platinum (Pt), tungsten (W), aluminum (Al), copper (Cu), tantalum (Ta), or titanium (Ti), a metal nitride such as titanium nitride (TiN), or tantalum nitride (TaN), or a combination thereof. However, the third line structure 290 may have substantially the same structure as the first line structure 210 and/or the second line structure 250.

In some implementations of the disclosed technology, the first line structure 210 may function as one of a word line and a bit line for driving the first memory cell MC1 and reading or writing data from or to the memory cell MC, while constituting part of the first MTJ structure. The second line structure 250 may function as any one of the word line and the bit line for driving the first memory cell MC1, and may function as any one of a word line and a bit line for driving the second memory cell MC2 while constituting part of the second MTJ structure. The third line structure 290 may function as the other of the word line and the bit line for driving the second memory cell MC2. When the first line structure 210 and the second line structure 250 includes a ferromagnetic material to have a specific resistivity greater than the third line structure 290, each of the thickness of the first line structure 210 and the thickness of the second line structure 250 may be greater than the thickness of the third line structure 290.

The memory device of implemented based on some embodiments of the disclosed technology can achieve all of the above-discussed effects and also can be highly integrated.

In some embodiments of the disclosed technology, three-layered line structures 210, 250, and 290 are disposed over the substrate 200 and the two-layered memory cells MC1 and MC2 are disposed therebetween, but the disclosed technology is not limited thereto. Line structures of four or more layers and memory cells of three or more layers may be disposed over a substrate. In this case, except for the uppermost line structure, the remaining line structures may have the same layer structure as each other, and may include at least a pinned layer. The uppermost line structure may have the same layer structure as the remaining line structures or may have a different layer structure from the remaining line structure. When the specific resistivity of the uppermost line structure is smaller than the specific resistivity of the remaining line structures, the thickness of the uppermost line structure may be smaller than the thickness of each of the remaining line structures.

In some embodiments of the disclosed technology, the free layer is disposed over the pinned layer and the selection element layer is disposed over the MTJ structure, but the disclosed technology is not limited thereto, and the vertical positions of the pinned layer and the free layer, and the vertical positions of the MTJ structure and the selection element layer may be varied, as will be described below by way of example with reference to FIGS. 3A and 3B.

Figure 3A:
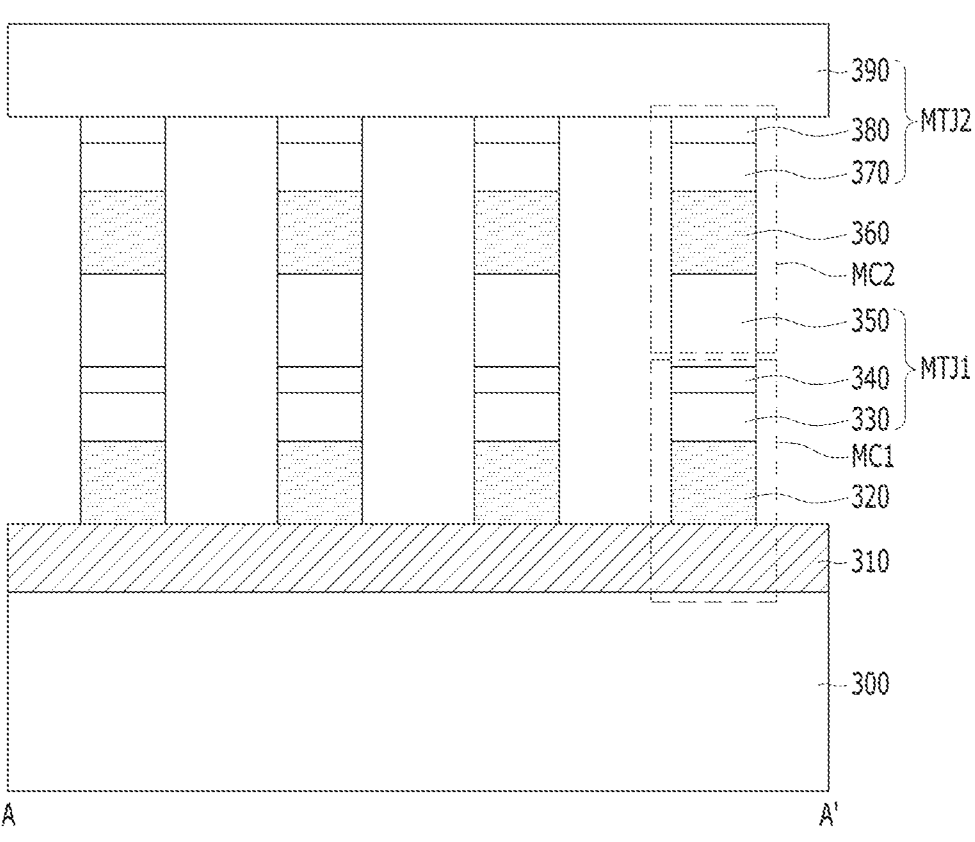
FIG. 3A is a cross-sectional view illustrating a memory device based on some embodiments of the disclosed technology.

FIG. 3A is a plan view illustrating a memory device based on some embodiments of the disclosed technology. FIG. 3B may substantially correspond to the cross-section taken along the line A-A' of FIG. 2A.

Referring to FIG. 3A, the memory device implemented based on some embodiments of the disclosed technology may include a substrate 300, a plurality of first line structures 310 disposed over the substrate 300 and extending in the first direction while being arranged to be spaced apart from each other in the second direction, a plurality of second line structures 350 disposed over the first line structures 310 and extending in the second direction while being arranged to be spaced apart from each other in the first direction, a plurality of third line structures 390 disposed over the second line structures 350 and extending in the first direction while being arranged to be spaced apart from each other in the second direction, a stacked structure of a first selection element layer 320, a first free layer 330, and a first tunnel barrier layer 340, which overlaps each of intersection regions of the first line structures 310 and the second line structures 350 between them, and a stacked structure of a second selection element layer 360, a second free layer 370, and a second tunnel barrier layer 380, which overlaps each of intersection regions of the second line structures 350 and the third line structures 390 between them.

Since the first line structure 310 is adjacent to the first selection element layer 320, a pinned layer may not be included. For example, the first line structure 310 may include a low-resistance conductive material such as a metal, and may have a single-layer structure.

On the other hand, the second line structure 350 may include at least a pinned layer, and thus a first MTJ structure including the pinned layer, the first tunnel barrier layer 340, and the first free layer 330 may be formed. The second line structure 350 may have a layer structure substantially the same as a structure in which top and bottom of the first line structure 110 of the above-described embodiment are inverted. The second line structure 350 and the first MTJ structure including the second line structure 350 will be described by way of example with reference to FIG. 3B below.

Figure 3B:
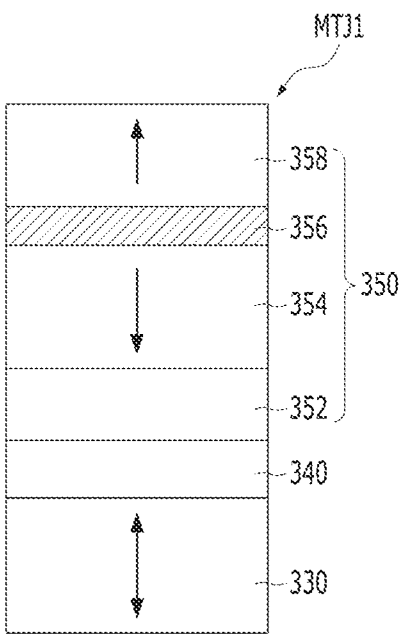
FIG. 3B is a view illustrating a first magnetic tunnel junction (MTJ) structure based on some embodiments of the disclosed technology.

FIG. 3B is a view illustrating the first MTJ structure based on some embodiments of the disclosed technology.

Referring to FIG. 3B, the first MTJ structure may include the first free layer 330, the first tunnel barrier layer 340 disposed over the first free layer 330, and the second line structure 350 disposed over the first tunnel barrier layer 340.

The second line structure 350 may include at least a pinned layer 354. Furthermore, the second line structure 350 may further include an interface layer 352, a magnetic correction layer 358, and a spacer layer 356. The interface layer 352 may be interposed between the pinned layer 354 and the tunnel barrier layer 340. The magnetic correction layer 358 may be disposed to face an upper surface of the pinned layer 354, which is opposite to a lower surface of the pinned layer 354 facing the free layer 330. The spacer layer 356 may be interposed between the magnetic correction layer 358 and the pinned layer 354.

Referring back to FIG. 3A, the third line structure 390 may include at least a pinned layer to form a second MTJ structure together with the second tunnel barrier layer 380 and the second free layer 370. The third line structure 390 may have substantially the same layer structure as the second line structure 350.

Since the second line structure 350 forms a part of the first MTJ structure and the third line structure 390 forms a part of the second MTJ structure, the first and second select element layers 320 and 360 may be disposed under the first and second MTJ structures, respectively.

The memory device implemented based on some embodiments of the disclosed technology can achieve all of the above-discussed effects and also can be highly integrated.

In some embodiments of the disclosed technology, three-layered line structures 310, 350, and 390 are disposed over the substrate 300 and the two-layered memory cells MC1 and MC2 are disposed therebetween, but the disclosed technology is not limited thereto. Line structures of four or more layers and memory cells of three or more layers may be disposed over a substrate. In this case, except for the lowermost line structure, the remaining line structures may have the same layer structure as each other, and may include at least a pinned layer. The lowermost line structure may have the same layer structure as the remaining line structures or may have a different layer structure from the remaining line structures. When the specific resistivity of the lowermost line structure is smaller than the specific resistivity of the remaining line structures, the thickness of the lowermost line structure may be smaller than the thickness of each of the remaining line structures.

In some embodiments of the disclosed technology, the tunnel barrier layer has an island shape overlapping with the intersection region of the upper and lower lines. In an implementation, the tunnel barrier layer may be patterned together with the free layer to have sidewalls aligned with the free layer has been described. However, in another implementation, the tunnel barrier layer may not be separated for each intersection region of the upper and lower lines. For example, the tunnel barrier layer may be formed in a line shape having sidewalls aligned with any one of the upper and lower lines by being patterned together with any one of the upper and lower lines. Alternatively, for example, the tunnel barrier layer may have a plate shape overlapping all of the memory cells by not being patterned. This will be exemplarily described with reference to FIGS. 4A to 5C.

Figure 4A:
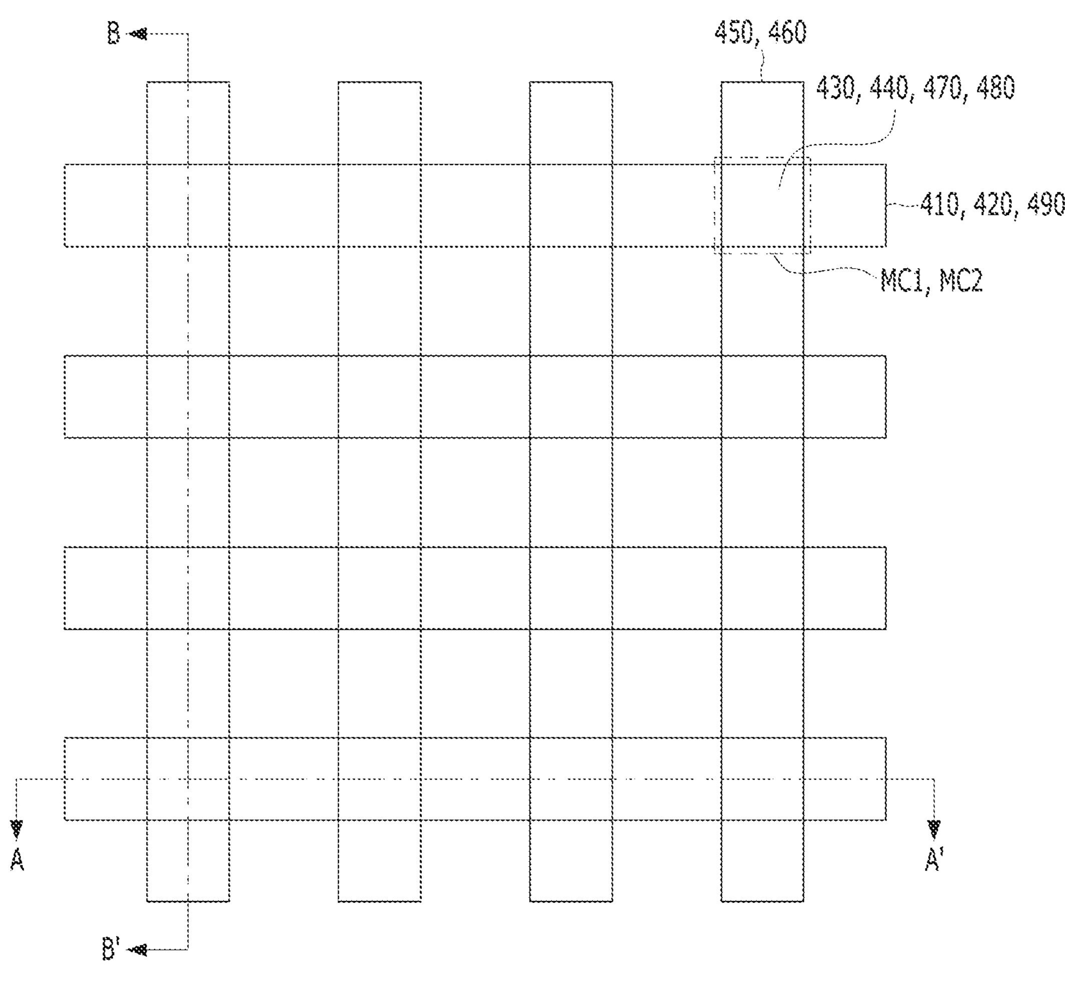
FIG. 4A is a plan view illustrating a memory device based on some embodiments of the disclosed technology.
Figure 4B:
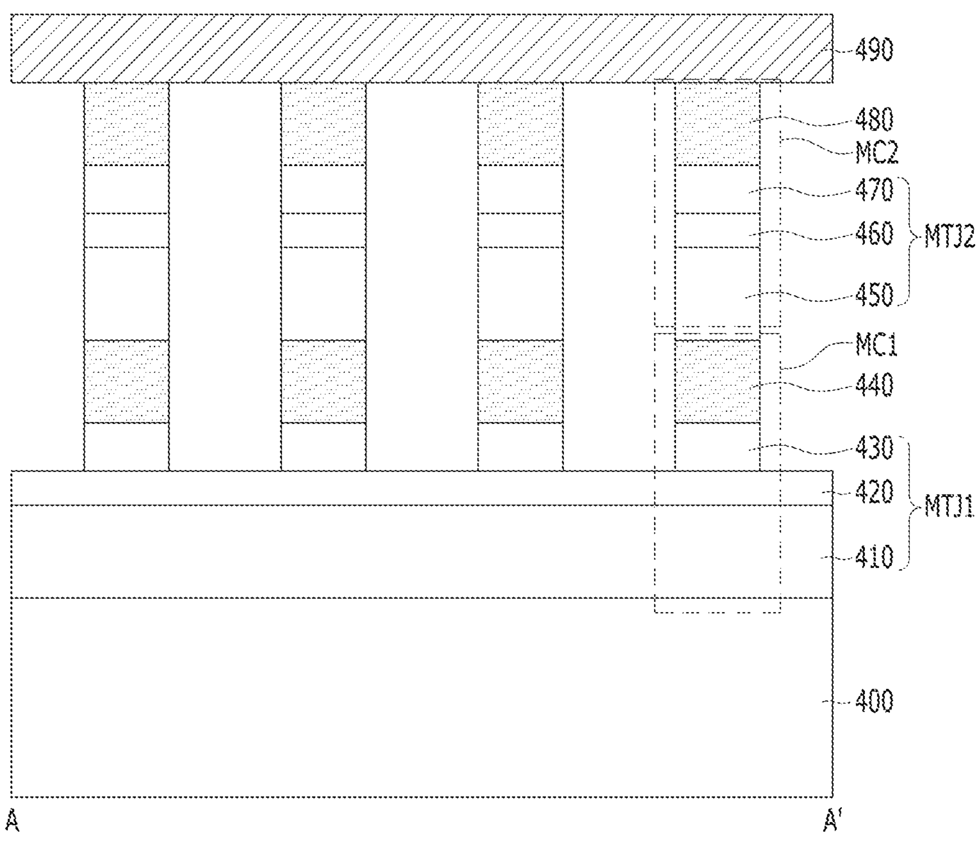
FIG. 4B is a cross-sectional view taken along a line A-A' of FIG. 4A.
Figure 4C:
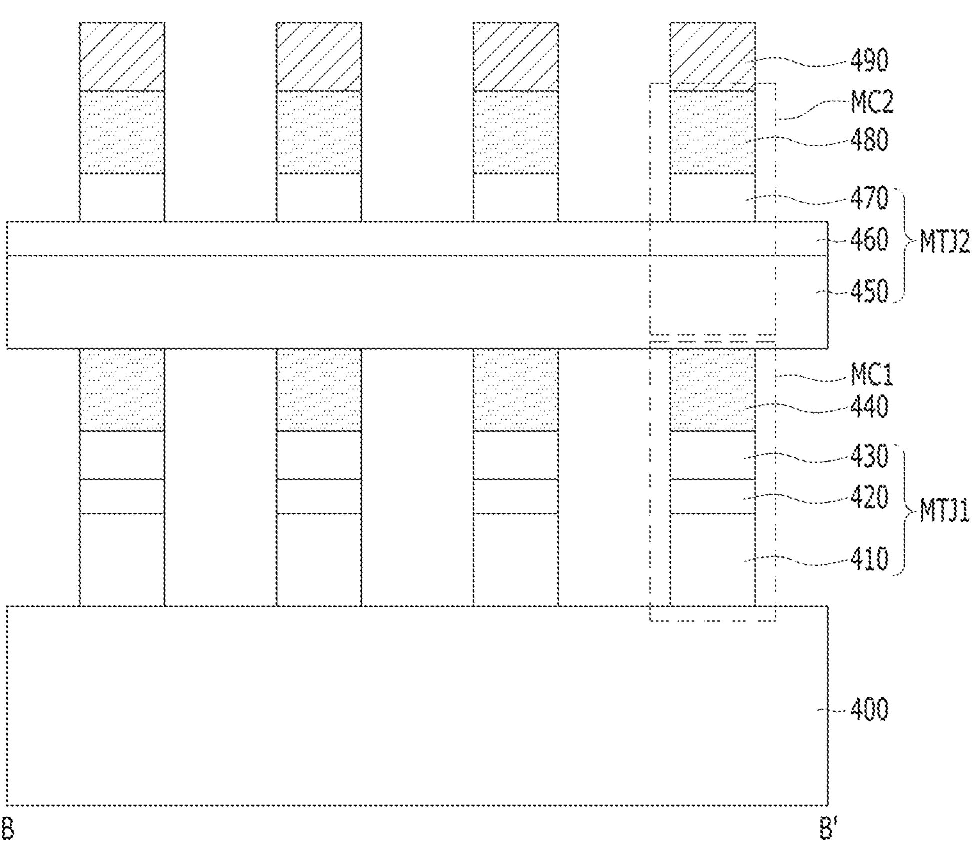
FIG. 4C is a cross-sectional view taken along a line B-B' of FIG. 4A.

FIG. 4A is a plan view illustrating a memory device based on some embodiments of the disclosed technology, FIG. 4B is a cross-sectional view taken along a line A-A' of FIG. 4A, and FIG. 4C is a cross-sectional view taken along a line B-B' of FIG. 4A.

Referring to FIGS. 4A to 4C, the memory device of some embodiments may include a substrate 400, a plurality of first line structures 410 disposed over the substrate 400 and extending in the first direction while being arranged to be spaced apart from each other in the second direction, a plurality of second line structures 450 disposed over the first line structures 410 and extending in the second direction while being arranged to be spaced apart from each other in the first direction, a plurality of third line structures 490 disposed over the second line structures 450 and extending in the first direction while being arranged to be spaced apart from each other in the second direction, a stacked structure of a first free layer 430 and a first selection element layer 440, which overlaps each of intersection regions of the first line structures 410 and the second line structures 450 between them, a stacked structure of a second free layer 470 and a second selection element layer 480, which overlaps each of intersection regions of the second line structures 450 and the third line structures 490 between them, a first tunnel barrier layer 420 interposed between the first free layer 430 and the first line structure 410 and overlapping the first line structure 410 to extend in the first direction, and a second tunnel barrier layer 460 interposed between the second free layer 470 and the second line structure 450 and overlapping the second line structure 450 to extend in the second direction.

For example, the first tunnel barrier layer 420 may have sidewalls aligned with the sidewalls of the first line structure 410 by being patterned together with the first line structure 410. The second tunnel barrier layer 460 may have sidewalls aligned with the sidewalls of the second line structure 450 by being patterned together with the second line structure 450.

In some embodiments of the disclosed technology, since a potential etching damage to the first and second tunnel barrier layers 420 and 460 is reduced, the characteristics of the first and second MTJ structures may be further improved.

Figure 5A:
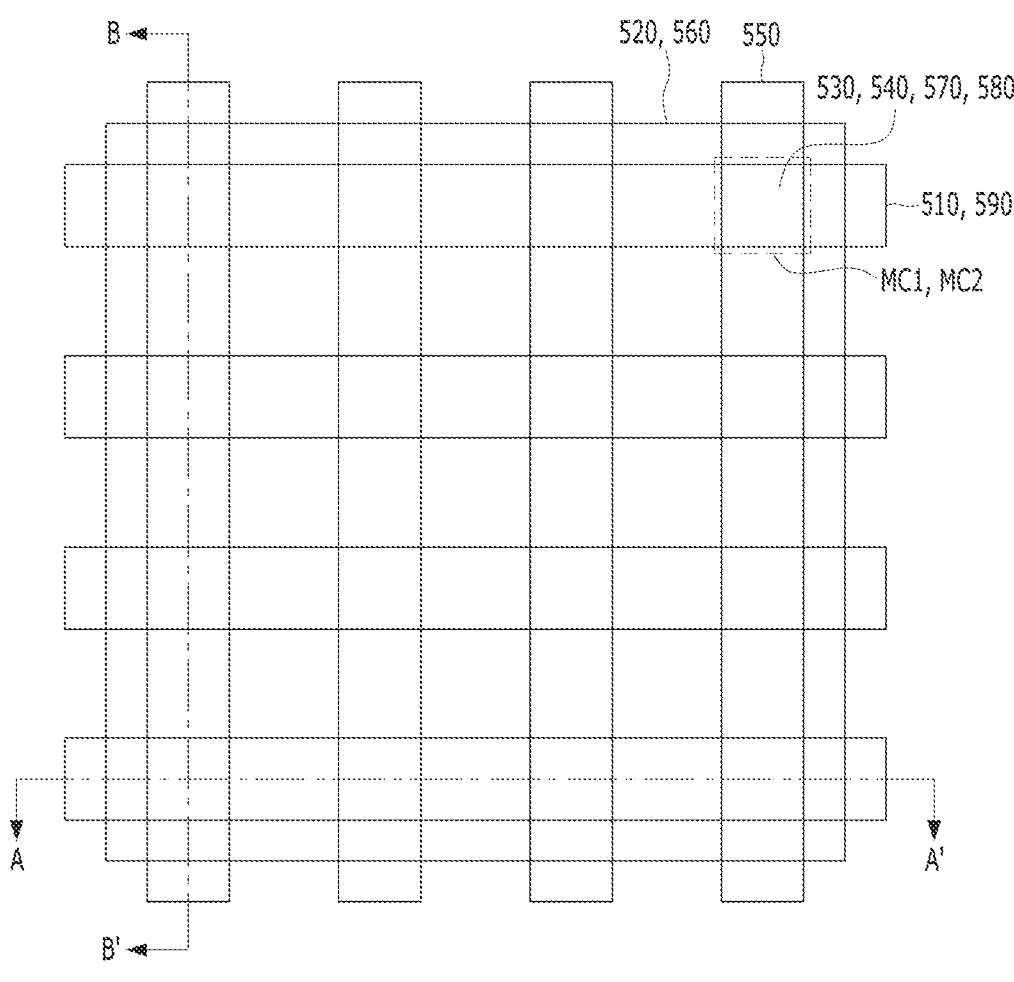
FIG. 5A is a plan view illustrating a memory device based on some embodiments of the disclosed technology.
Figure 5B:
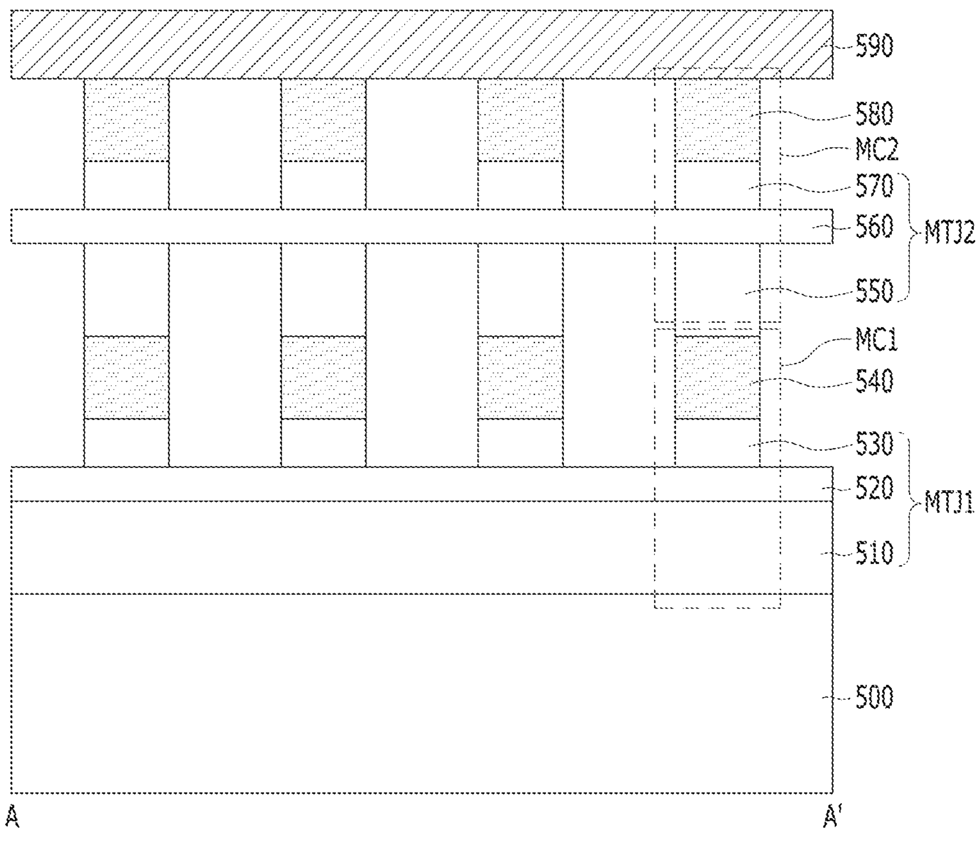
FIG. 5B is a cross-sectional view taken along a line A-A' of FIG. 5A.
Figure 5C:
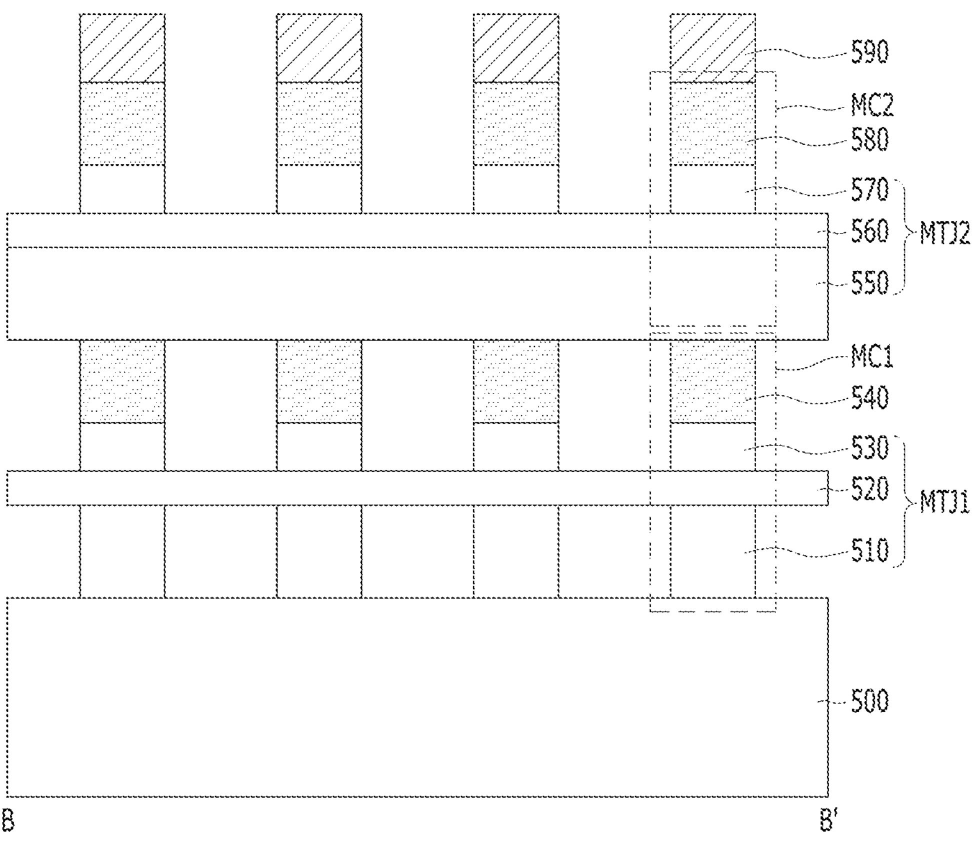
FIG. 5C is a cross-sectional view taken along a line B-B' of FIG. 5A.

FIG. 5A is a plan view illustrating a memory device based on some embodiments of the disclosed technology, FIG. 5B is a cross-sectional view taken along a line A-A' of FIG. 5A, and FIG. 5C is a cross-sectional view taken along a line B-B' of FIG. 5A.

Referring to FIGS. 5A to 5C, the memory device of some embodiments may include a substrate 500, a plurality of first line structures 510 disposed over the substrate 500 and extending in the first direction while being arranged to be spaced apart from each other in the second direction, a plurality of second line structures 550 disposed over the first line structures 510 and extending in the second direction while being arranged to be spaced apart from each other in the first direction, a plurality of third line structures 590 disposed over the second line structures 550 and extending in the first direction while being arranged to be spaced apart from each other in the second direction, a stacked structure of a first free layer 530 and a first selection element layer 540, which overlaps each of intersection regions of the first line structures 510 and the second line structures 550 between them, a stacked structure of a second free layer 570 and a second selection element layer 580, which overlaps each of intersection regions of the second line structures 550 and the third line structures 590 between them, a first tunnel barrier layer 520 interposed between the first free layer 530 and the first line structure 510 and having a plate shape, and a second tunnel barrier layer 560 interposed between the second free layer 570 and the second line structure 550 and having a plate shape.

For example, the first tunnel barrier layer 520 and the second tunnel barrier layer 560 may not be patterned. Accordingly, each of the first tunnel barrier layer 520 and the second tunnel barrier layer 560 may have a shape overlapping all of the first free layers 530 and all of the second free layers 570.

In some embodiments of the disclosed technology, it is possible to avoid a potential etch damage to the first and second tunnel barrier layers 520 and 560, so that the characteristics of the first and second MTJ structures may be further improved.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:

a plurality of first line structures extending in a first direction, each of the plurality of first line structures including a first pinned layer exhibiting a magnetization in a fixed magnetization direction;

a plurality of second line structures spaced apart from the plurality of first line structures and extending in a second direction intersecting the first direction;

a plurality of first free layers each exhibiting a magnetization with a magnetization direction that is changeable, the plurality of first free layers respectively overlapping intersection regions of the plurality of first line structures and the plurality of second line structures between the plurality of first line structures and the plurality of second line structures; and a first tunnel barrier layer interposed between the plurality of first line structures and the plurality of first free layers, wherein the first pinned layer is within a corresponding first line structure, and wherein, in the first direction, a sidewall of the first pinned layer is not aligned with a sidewall of a corresponding first free layer.

2. The semiconductor device according to claim 1, wherein the first tunnel barrier layer overlaps the plurality of first free layers and has a sidewall aligned with a sidewall of the plurality of first free layers.

3. The semiconductor device according to claim 1, wherein the first tunnel barrier layer overlaps the plurality of first line structures and has a sidewall aligned with a sidewall of the plurality of first line structures.

4. The semiconductor device according to claim 1, wherein the first tunnel barrier layer has a plate shape overlapping all of the plurality of first free layers.

5. The semiconductor device according to claim 1, wherein the plurality of second line structures includes a conductive material having a specific resistivity smaller than a specific resistivity of the plurality of first line structures.

6. The semiconductor device according to claim 5, wherein a thickness of the plurality of first line structures is greater than a thickness of the plurality of second line structures.

7. The semiconductor device according to claim 1, wherein the plurality of first line structures and the plurality of second line structures have the same layer structure.

8. The semiconductor device according to claim 1, further comprises:

a plurality of third line structures spaced apart from the plurality of second line structures and extending in the first direction;

a plurality of second free layers respectively overlapping intersection regions of the plurality of second line structures and the plurality of third line structures between the plurality of second line structures and the plurality of third line structures, each of the plurality of second free layers having a changeable magnetization direction; and a second tunnel barrier layer interposed between a corresponding second line structure and a corresponding second free layer, wherein the corresponding second line structure includes a second pinned layer having a fixed magnetization direction.

9. The semiconductor device according to claim 8, wherein the second tunnel barrier layer overlaps the corresponding second free layer and has a sidewall aligned with a sidewall of the corresponding second free layer.

10. The semiconductor device according to claim 8, wherein the second tunnel barrier layer overlaps the corresponding second line structure and has a sidewall aligned with a sidewall of the corresponding second line structure.

11. The semiconductor device according to claim 8, wherein the second tunnel barrier layer has a plate shape overlapping all of the plurality of second free layers.

12. The semiconductor device according to claim 8, wherein the plurality of third line structures includes a conductive material having a specific resistivity smaller than a specific resistivity of each of the plurality of first line structures and the plurality of second line structures.

13. The semiconductor device according to claim 12, wherein a thickness of each of the plurality of first line structures and the plurality of second line structures is greater than a thickness of the third line structure.

14. The semiconductor device according to claim 8, wherein the plurality of first line structures, the plurality of second line structures, and the plurality of third line structures have the same layer structure.

15. The semiconductor device according to claim 1, wherein the plurality of first line structures further includes a magnetic correction layer having a magnetization direction opposite to the magnetization direction of the first pinned layer, and a spacer layer interposed between the first pinned layer and the magnetic correction layer.

16. The semiconductor device according to claim 1, wherein the plurality of first line structures further includes an interface layer interposed between the first pinned layer and the first tunnel barrier layer.

17. The semiconductor device according to claim 1, wherein overlapped sections of the plurality of first line structures, the plurality of first free layers and the first tunnel barrier layer form a structure for storing data based on a relative direction between magnetization directions of the plurality of first line structures and the plurality of first free layers.

* * * * *